(12) United States Patent
Nicholls et al.

(10) Patent No.: US 8,704,562 B2
(45) Date of Patent: Apr. 22, 2014

(54) ULTRA LOW PHASE NOISE SIGNAL SOURCE

(75) Inventors: Charles William Tremlett Nicholls, Nepean (CA); Walid Hamdane, Ottawa (CA)

(73) Assignee: Nanowave Technologies Inc., Etobicoke, Ontario (CA)

(*) Notice: Subject to any disclaimer, the term of this patent is extended or adjusted under 35 U.S.C. 154(b) by 0 days.

(21) Appl. No.: 13/549,698

(22) Filed: Jul. 16, 2012

(65) Prior Publication Data
US 2014/0015572 A1    Jan. 16, 2014

(51) Int. Cl.
*H03L 7/00*    (2006.01)

(52) U.S. Cl.
USPC ........... 327/152; 327/144; 327/146; 327/147; 327/149

(58) Field of Classification Search
USPC .............. 327/141, 144–163; 331/15–17; 375/373–376
See application file for complete search history.

(56) References Cited

U.S. PATENT DOCUMENTS

| | | | |
|---|---|---|---|
| 4,225,828 A * | 9/1980 | Watanabe et al. | 331/1 A |
| 5,254,955 A * | 10/1993 | Saeki et al. | 327/156 |
| 5,260,671 A * | 11/1993 | Iso et al. | 329/302 |
| 5,343,168 A * | 8/1994 | Guthrie | 331/16 |
| 5,563,921 A * | 10/1996 | Mesuda et al. | 375/376 |
| 6,150,890 A * | 11/2000 | Damgaard et al. | 331/14 |
| 6,573,769 B1 * | 6/2003 | Zhang et al. | 327/156 |
| 6,859,509 B1 | 2/2005 | Koudelka | |
| 7,675,379 B1 * | 3/2010 | Groe | 332/144 |
| 2004/0101081 A1 * | 5/2004 | Hsu | 375/376 |
| 2009/0309665 A1 | 12/2009 | Chenakin | |
| 2011/0148484 A1 * | 6/2011 | Kim et al. | 327/148 |
| 2011/0204937 A1 * | 8/2011 | Demirkan | 327/157 |
| 2013/0007929 A1 * | 1/2013 | Porthun | 850/8 |
| 2013/0285724 A1 * | 10/2013 | Staszewski et al. | 327/159 |

FOREIGN PATENT DOCUMENTS

| | | |
|---|---|---|
| CA | 2097652 A1 | 12/1993 |
| EP | 1873919 A1 | 1/2008 |
| GB | 2466233 B | 11/2010 |
| WO | 2002/101403 A2 | 12/2002 |

OTHER PUBLICATIONS

Hafez et al., "A Novel Low Power Low Phase-Noise PLL Architecture for Wireless Transceivers", Proceeding GLS '99 Proceedings of the Ninth Great Lakes Symposium on VLSI, IEEE Computer Society Washington, DC, USA © 1999, 4 pages.

(Continued)

*Primary Examiner* — Brandon S Cole
(74) *Attorney, Agent, or Firm* — Alexander Anishchenko; Borden Ladner Gervais LLP

(57) ABSTRACT

An apparatus and method for providing an output signal. The apparatus comprises an input for receiving a reference signal, an oscillator for providing an output signal, and an offset signal generator for frequency multiplying the reference signal to generate an offset signal that has a plurality of frequency products in a plurality of frequency bands. The apparatus further includes a mixer for mixing the offset signal with the output signal to produce a combined signal, an offset frequency selector for controllably selecting a frequency band of the offset signal, and a difference detector for detecting a difference between the reference signal and the combined signal and for providing a control signal to the oscillator based on the detected difference.

16 Claims, 4 Drawing Sheets

(56) References Cited

OTHER PUBLICATIONS

Yongke, "The Design of Wide BW Frequency Synthesizer Based on the DDS&PLL Hybrid Method", The Ninth International Conference on Electronic Measurement & Instruments, ICEMI Aug. 16-19, 2009, pp. 2-689-2-692.

Bonfanti et al., "A DDS-Based PLL for 2A-GHz Frequency Synthesis", IEEE Transactions on Circuits and Systems—II: Analog and Digital Signal Processing, vol. 50, No. 12, Dec. 2003, pp. 1007-1010.
International Patent Application No. PCT/CA2013/050525, International Search Report dated Sep. 17, 2013.

* cited by examiner

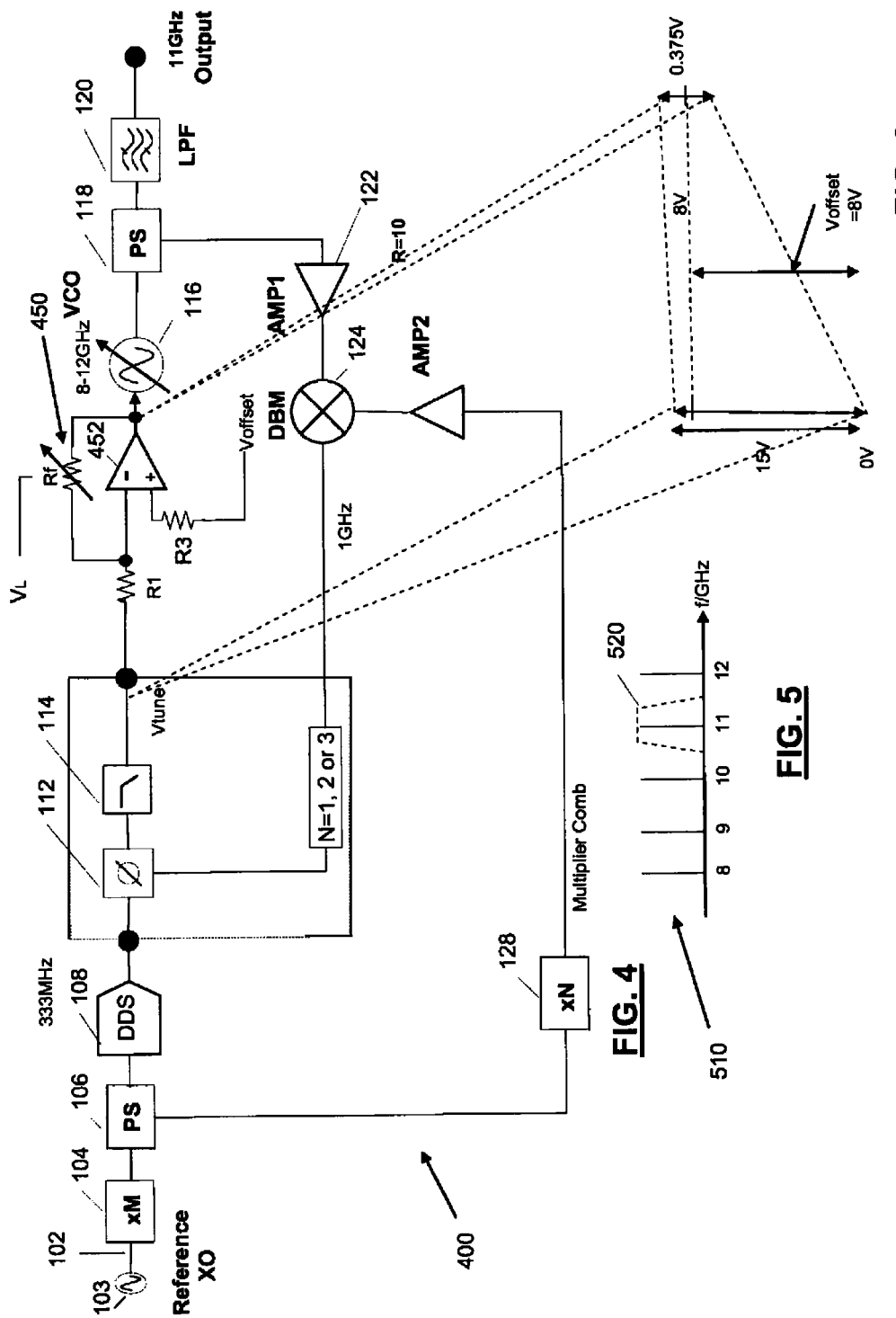

ULTRA LOW PHASE NOISE SIGNAL SOURCE

FIELD

The present disclosure relates generally to signal sources. More particularly, the present disclosure relates to system and methods for generating a signal with low phase noise.

BACKGROUND

Signal sources are used to generate signals for use in variety of electronic systems. An example of a signal source is a frequency synthesizer. Frequency synthesizers are often used to provide a signal at a particular frequency. Frequency synthesizers can include a Phase Locked Loop (PLL) circuit to lock onto an input signal and produce an output signal at a different frequency. Improvements in signal source circuits are desirable.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides an apparatus for providing an output signal, the apparatus comprising: an input for receiving a reference signal; an oscillator for providing an output signal; an offset signal generator for frequency multiplying the reference signal to generate an offset signal, the offset signal having a plurality of frequency products in a plurality of frequency bands; an offset frequency selector for controllably selecting a frequency band of the offset signal; a mixer for mixing the offset signal with the output signal to produce a combined signal; and a difference detector for detecting a difference between the reference signal and the combined signal and for providing a control signal to the oscillator based on the detected difference.

In some embodiments the difference detector is a phase frequency detector.

In some embodiments, the offset frequency selector comprises: a plurality of band-pass filters; and at least one switch coupled between the offset frequency generator and the plurality of band-pass filters for band selecting a frequency band of the offset signal.

In various embodiments, the offset frequency selector comprises a dielectric resonator oscillator or a comb generator for generating a comb of offset frequencies.

In some embodiments, the offset frequency selector comprises a control signal adjustor coupled between the control signal generator and the oscillator, for adjusting the control signal to correspond to one of the frequency bands of the offset frequency.

In some embodiments, the control signal adjuster scales and provides an offset to the control signal.

In some embodiments, the scaling amplifier comprises an inverting amplifier.

In some embodiments, the amplifier has a gain of less than unity.

In some embodiments, the method further comprises a frequency divider coupled between the mixer and the difference detector; and wherein the frequency divider has a factor not substantially exceeding 3.

In some embodiments, the mixer is directly coupled to the difference detector such that difference detector receives the feedback signal without any frequency division.

In another aspect, the disclosure provides a method of generating a reference signal, the method comprising: receiving an input signal; detecting a phase difference between a feedback signal and the input signal; generating an output signal based on the detected difference; generating an offset signal by frequency multiplying the reference signal, the offset signal having a plurality of frequency products in a plurality of frequency bands; selecting a frequency band of the offset signal; and mixing the offset signal with the output signal to generate the feedback signal.

In some embodiments, the frequency band is selected by a bank of band-pass filters.

In some embodiments, the offset frequency is selected by a dielectric resonator oscillator.

In some embodiments, the offset signal comprises generating a comb of offset frequencies.

In some embodiments, the output signal is generated by applying a control signal to an oscillator; and wherein the frequency band of the offset frequency is selected by adjusting the control signal applied to the oscillator to correspond to one of the frequency bands of the offset frequency.

In some embodiments, the control signal is adjusted by: scaling the control signal; and providing an offset to the control signal.

In some embodiments, the control signal is adjusted by an inverting amplifier.

In some embodiments, the amplifier has a gain of less than unity.

In some embodiments, the method further comprises frequency dividing the feedback signal by a factor N, a magnitude of factor N not substantially exceeding 3; and wherein detecting a phase difference between the feedback signal and the input signal comprises detecting a phase difference between the frequency divided feedback signal and the input signal.

In some embodiments, detecting a phase difference between the feedback signal and the input signal comprises detecting a phase difference between the feedback signal and the input signal without frequency dividing the feedback signal.

Other aspects and features of the present disclosure will become apparent to those ordinarily skilled in the art upon review of the following description of specific embodiments in conjunction with the accompanying figures.

BRIEF DESCRIPTION OF THE DRAWINGS

FIGS. 1 to 4 are block diagrams of frequency synthesizer circuits in accordance with various embodiments;

FIG. 5 illustrates an example of a comb of offset frequencies at a node of the frequency synthesizer circuit of FIG. 4, according to some embodiments; and FIG. 6 illustrates possible relationships between the voltage at two nodes of the frequency synthesizer circuit of FIG. 4, according to some embodiments.

DETAILED DESCRIPTION

Figure 1:
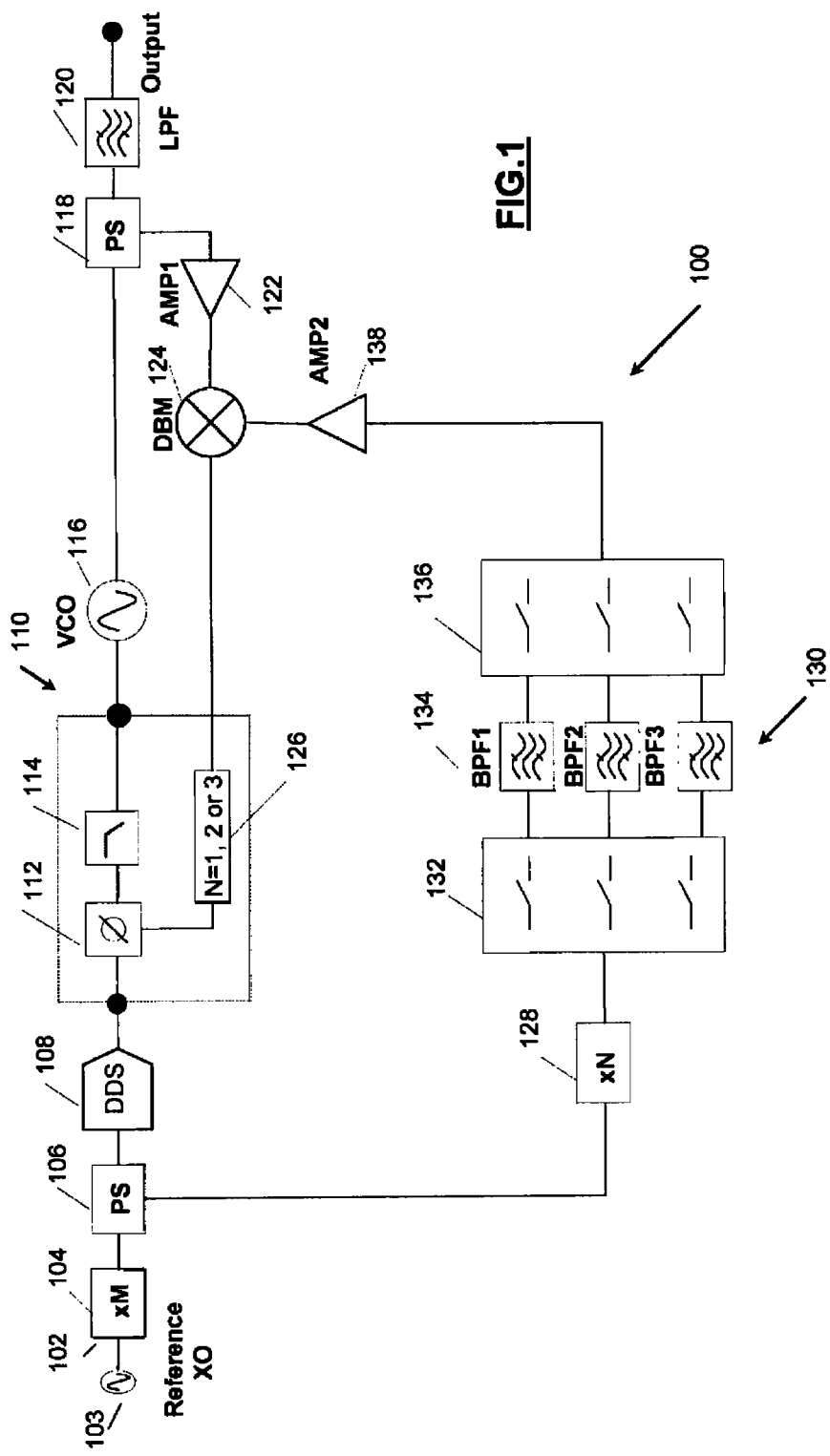

Signal sources are used to generate signals for use in variety of electronic systems. An example of a signal source is a frequency synthesizer. Frequency synthesizers are electronic systems that are used to generate an output signal at a desired frequency based on an input signal. Frequency synthesizers are utilized in a wide array of applications including, but not limited to, radio communications, satellite communications, GPS systems, interferometric systems and radar systems.

Some frequency synthesizers utilize a PLL (phase locked loop) to lock onto a stable low frequency crystal reference input signal and produce an output signal at a different frequency than the input signal. For example, the output signal is often at a higher frequency than the input signal. This is often accomplished in PLL frequency synthesizers by including a frequency divider in the feedback loop of the PLL. The frequency divider divides the output signal by a factor N in the feedback loop. In the case that the feedback path contains only a frequency divider, for values of N greater than 1, the resulting output signal is at a higher frequency than the input signal.

The performance of known synthesizer technology is limited by, for example, the synthesizer phase noise floor and the synthesizer spurious output. Typical systems require a frequency step resolution of the synthesizer that results in a high value of the synthesizer N value. The phase noise in the output signal of a synthesizer is generally a function of N. For example, in some systems, the noise present in the signal applied to the PLL is transferred to the output by a factor of $20 \log_{10}(N)$. Accordingly, for large values of N, the output includes a significant phase noise component.

Systems and applications that utilize frequency synthesizers exhibit better performance when the output of the frequency synthesizer has lower phase noise. In other words, lower phase noise in a synthesizer output signal can result in improved performance of the system in which the output signal of the synthesizer is utilized. This can particularly be the case in applications where it is desirable to distinguish low level receive signals, such as in, for example, but not limited to, high performance radar, and communication systems. A frequency accurate output signal with low phase noise determines the signal detection performance of such systems given that it allows for low level signals to be detected.

At the same time, such high end systems often require high frequency signals (i.e. short wavelength) in order to take advantage of certain propagation characteristics of the signal. For example, microwave systems are an example of a type of system to which the embodiments disclosed herein may be applied. Microwaves include electromagnetic radiation in the band of frequencies ranging from about 300 MHz to 300 GHz. In various microwaves systems, it is desirable to have signals in the gigahertz range. This desire for high frequency output signals in conjunction with fine frequency adjustment is one of the reasons that a high value of N is often utilized. As mentioned above, a high value of N allows for the output frequency to be at a higher frequency than the input signal.

A synthesizer that is able to limit the value of N to a value that is close to 1, without limiting the magnitude of frequency or minimum frequency step size of the output signal, can improve performance of various applications. Such a frequency synthesizer would allow for the use of a high frequency signal without the large noise component that would be present in a system that utilizes a high value of N. Various embodiments disclosed herein relate to high frequency and ultra low phase noise frequency synthesizers. Some embodiments relate to a microwave frequency synthesizer.

Various embodiments disclosed herein generally relate to systems and methods for providing an output signal having low phase noise. Some embodiments relate to a frequency synthesizer that produces an output signal having low phase noise. Various embodiments disclosed herein relate to frequency synthesizers that enable the use of a low value of N. In some embodiments, the N value does not exceed 3. In some embodiments, the N value is 1, which provides optimal phase noise and spurious output for the employed component technologies. In some embodiments, the feedback loop of the PLL does not include a frequency divider. As mentioned above, the noise present in the signal applied to the PLL can be transferred to the output signal according to $20 \log_{10}(N)$. Accordingly, for low values of N, such as for example, in the range of 1 to 3, the noise will be significantly reduced as compared to similar systems that utilize higher values of N.

In various embodiments, the circuit configuration is simple and robust and requires no special alignment. For example, some embodiments described herein do not require any factory tuning prior to deployment of the unit.

Reference is first made to FIG. 1, which is a block diagram of a frequency synthesizer 100, according to various embodiments. In some embodiments, frequency synthesizer 100 is an ultra low phase noise broadband reference signal source. Frequency synthesizer 100 receives an input signal at an input port 102 from, for example, a low phase noise crystal reference source 103. The input signal is then multiplied by multiplier 104. Power splitter 106 splits the multiplied input signal and outputs it to two circuit branches.

In the first branch, the signal passes through a direct digital synthesizer (DDS) 108, the output of which is fed into a phase-locked loop (PLL) circuit 110. PLL circuit 110 comprises a phase frequency detector 112, a low pass filter 114, a voltage controlled oscillator 116, a power splitter 118, a low pass output filter 120, an amplifier 122 and a mixer 124.

Low pass filter 114 removes the comparison frequency, spurious signals and harmonics that are generated by, for example, the phase frequency detector 112, multiplier 104 and mixer 124. The output of low pass filter 114 serves as a control signal for voltage controlled oscillator. In various embodiments, voltage controlled oscillator 116 is used to produce a microwave output. The output of low pass filter 120 provides the output signal of frequency synthesizer 100. In some embodiments, low pass filter 120 is a low-cost micro strip implementation. In such embodiments, a more expensive implementation is not required given that low pass filter 120 is only used to filter the harmonics of voltage controlled oscillator 116.

Amplifier 122 is coupled to a mixer 124 and a frequency divider 126 to form a feedback path to discriminator 112. Mixer 124, in addition to the output of amplifier 122, receives an offset signal, which will be discussed in greater detail below. Mixer 124 mixes these two signals and provides the resulting signal to divider 126.

Divider 126 divides the output of mixer 124 by a factor N. In various embodiments, the magnitude of N is restricted to a value of 3 or less. In other embodiments, N can exceed 3. In general, as mentioned above, the phase noise in the loop band is given by the function $20 \log_{10}(N)$. Accordingly, by limiting the magnitude of N, the phase noise is kept low with optimal phase noise for the system being achieved when the divider has a value of N=1.

The output port of divider 126 is coupled to one input of the phase frequency detector 112. A second input port of phase frequency detector receives the output of DDS 108. Phase frequency detector 112 detects a phase and frequency difference between the output signal of DDS 108 (the reference signal) and the output signal of divider 126 (the feedback signal) and provides an output signal based on the detected difference. As mentioned above, the filtered output signal of phase frequency detector 112 serves as a control signal for oscillator 116. The DDS provides fine frequency step tuning of the synthesizer.

The second branch to which power splitter 106 outputs the multiplied input signal is used to generate an offset signal.

Coupled to the second output port of power splitter 106 is a frequency multiplier 128. In some embodiments, frequency multiplier 128 can be referred to as the offset signal generator. Frequency multiplier 128 is coupled to a bandpass switched filter bank 130.

In some embodiments, bandpass switched filter bank 130 comprises an input bank of switches 132, a plurality of bandpass filters 134, and an output bank of switches 136. Bandpass switched filter bank 130 is used to select a particular frequency component of the output of frequency multiplier 128 and therefore, filter bank 130 can be referred to as an offset frequency selector. In various embodiments, the bandpass filters can be implemented using low-cost surface acoustic wave (SAW) technology and can be made relatively small and compact. The output of bandpass switched filter bank 130 is coupled to amplifier 138 which in turn is coupled to mixer 124.

Figure 2:
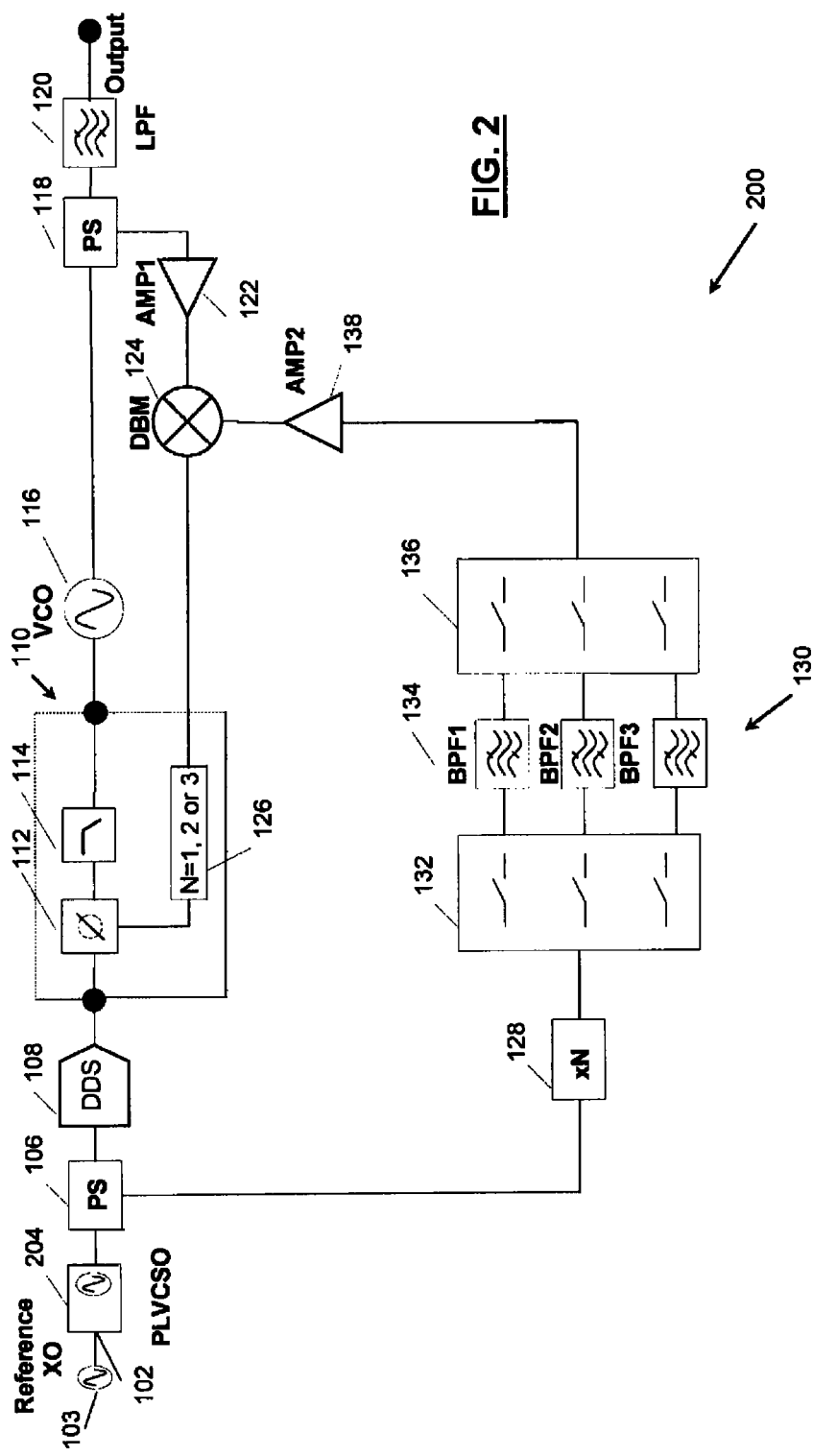

Reference is now made to FIG. 2, which is a block diagram of a frequency synthesizer 200 according to various embodiments. Frequency synthesizer 200 is similar to frequency synthesizer 100 and the common elements are similarly numbered in FIGS. 1 and 2. Frequency synthesizer 200 includes a phase locked voltage controlled surface acoustic wave oscillator (PLVCSO) 204. PLVCSO 204 is used to generate a 1 GHz reference signal. The PLVCSO can provide lower phase noise at offsets beyond 1 MHz than a multiplied crystal reference and is consequently advantageous for some applications where the noise requirements at the 1 MHz offset is most stringent. The PLVCSO also avoids the generation of multiple low frequency harmonics that are the case for a crystal multiplier. Consequently, the PLVCSO presents a potentially lower spurious solution to the one in which the crystal reference is multiplied.

Figure 3:
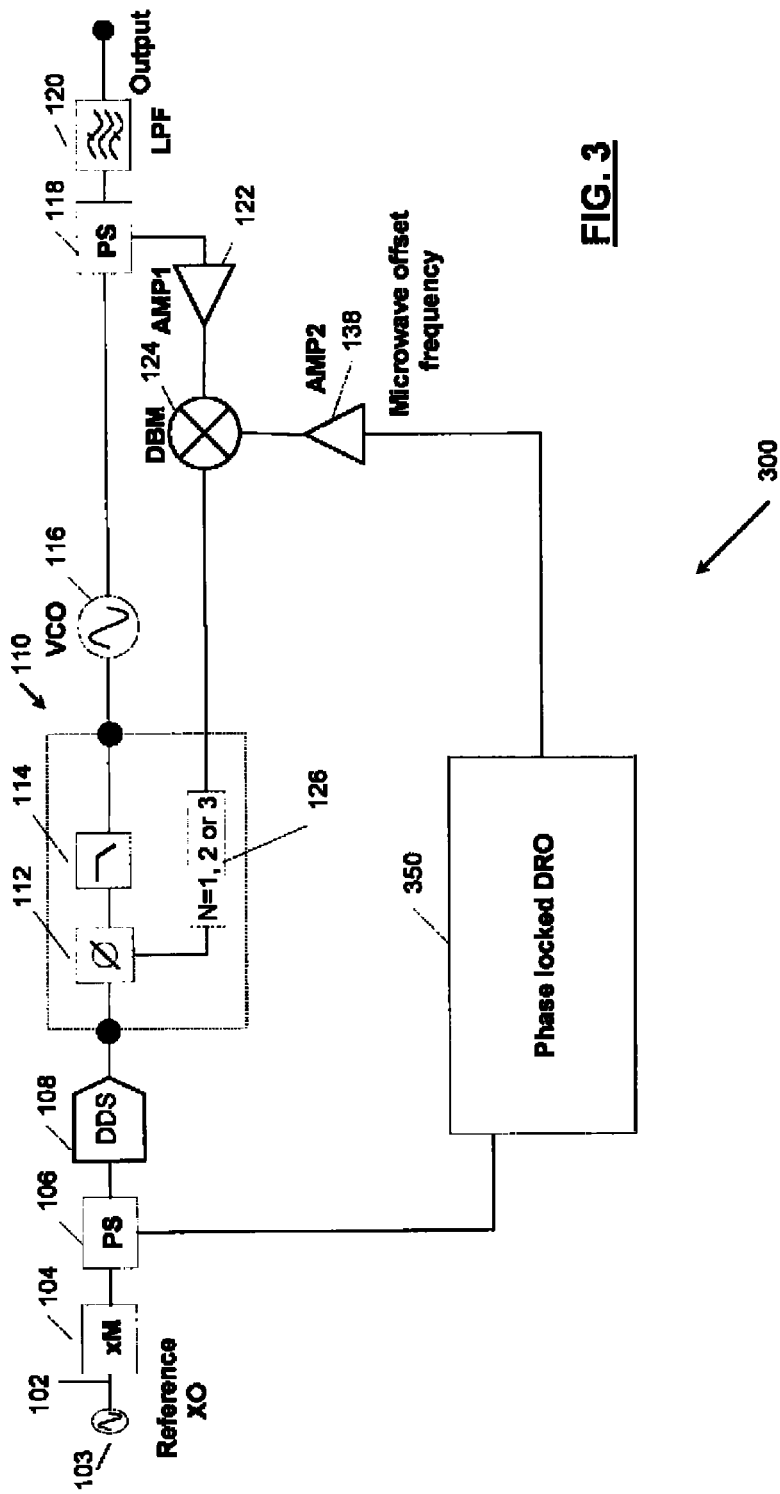

Reference is now made to FIG. 3, which is a block diagram of a frequency synthesizer 300 according to various embodiments. Frequency synthesizer 300 has some elements that are similar to those of frequency synthesizer 100 and are similarly numbered. The description of these common elements will not be repeated here.

Frequency synthesizer 300 includes a phase locked dielectric resonator oscillator (PLDRO) 350 to generate an offset frequency signal. The PLDRO provides lower phase noise at offsets at 1 MHz and higher than a multiplied crystal reference. In systems that require low phase noise at these higher offsets use of a PLDRO as the feedback reference source allows the system to achieve the desired performance.

Reference is now made to FIG. 4, which is a block diagram of a frequency synthesizer 400 according to various embodiments. Frequency synthesizer 400 has some elements that are similar to those of frequency synthesizer 100 and are similarly numbered. The description of these features will not be repeated here.

Frequency synthesizer 400 utilizes multiplier 128 as a comb generator to generate a comb of offset frequencies. FIG. 5 illustrates an example of a comb 510 of offset frequencies that can be produced by multiplier 128. In some embodiments, a PLVCSO can be utilized in place of multiplier 128 for lower phase noise. Unlike some other embodiments described herein, frequency synthesizer 400 does not filter the offset frequency signal prior to applying it to mixer 124. Instead, a control signal adjustor circuit 450 is utilized to adjust the control signal applied to the voltage controlled oscillator 460. The adjustment has an effect that is similar to that of filter bank 130 of FIG. 1. Accordingly, circuit 450 effectively selects a particular frequency band of the offset signal and can therefore be referred to as an offset frequency selector.

In some embodiments, circuit 450 is implemented as an inverting amplifier that includes an operational amplifier 452, a first resistor R1, a feedback resistor Rf, and a third resistor R3. In some embodiments, feedback resistor Rf is a variable resistor in order to provide a variable gain to circuit 450. In some embodiments, Rf is a digital potentiometer. The gain of circuit 450 is given by the equation $Av=-Rf/R1$. In various embodiments, the gain is selected to be less than 1 which limits the maximum tuning voltage that can be applied to the voltage controlled oscillator, which in turn reduces the locking range of the PLL circuit. Restriction of the tuning voltage enables control over the frequency range of operation of the phase locked oscillator. Reduction of the locking range of the synthesizer ensures that the control loop will always lock to the offset frequency that falls within the locking range of the synthesizer. If for example the offset signal consists of a comb of frequencies as produced by a frequency multiplier then if the full broadband operation of the loop is enabled then there will be an ambiguity as to which offset the loop will lock to. By limiting the locking range of the loop such that only one comb frequency satisfies the lock condition the loop by design can be made to lock in a consistent manner to a particular comb frequency. The approach has great advantage in that the other comb frequencies are not required to be filtered consequently there is no requirement for a switch filter bank. The resistor Rf can be controlled by digital means in some embodiments to enable the locking range of the voltage controlled oscillator to be controlled digitally. The control voltage used to control the locking range is the locking range voltage ($V_L$).

In various embodiments, circuit 450 also provides an offset voltage to the control signal. The offset voltage moves the reduced locking range within the locking bandwidth of the synthesizer. In other words, the offset voltage centers the locking voltage range. Consequently by means of manipulating the offset voltage and the locking range voltage the full locking range of the synthesizer can be covered. Since there is a priori knowledge of the synthesizer output frequency the locking range voltage and offset frequency select voltages can be set to ensure an unambiguous phase lock to a single comb frequency spur. This can be accomplished by applying a DC voltage at node 454. The voltage applied to node 454 can be referred to as the offset frequency select voltage. The offset frequency select voltage can be generated by means of a DAC (Digital to Analog Converter) to enable frequency setting of the synthesizer from a digital command signal.

Reference is now made to FIG. 6, which illustrates the relationship between the voltage at the input of circuit 450 and the voltage output of circuit 450, according to some embodiments. As can be seen, the voltage signal at the input of circuit 450 has a larger voltage swing than that of the output when the resistors of circuit 450 are selected to provide a gain of less than 1. In the embodiment illustrated, Rf is selected to be 1/40 of the magnitude of R1 to provide a gain having a magnitude of 1/40. Accordingly, when the voltage swing of the signal at the input of circuit 450 has a magnitude of 15 V, the voltage swing at the output of circuit 450 is 0.375 V which reduces the locking range of the synthesizer to 1/40 of its original range.

The offset voltage is used to center the reduced locking range about one of the offset comb frequency to which the system will lock. For example, if voltage controlled oscillator has an operating range of between 8 and 12 GHz, then reducing the locking range by a factor of 40 reduces the instantaneous locking bandwidth to 100 MHz from 4000 MHz. The frequency offset voltage can then be set to the tuning voltage required for 11 GHz. Only the comb frequency that is ±50

MHz offset from 11 GHz will cause the loop to lock, consequently the loop is constrained to lock on a single comb frequency resulting in a consistent lock frequency.

The offset frequency selection voltage can be used to select the mode of operation according to Table 1:

TABLE 1

| $F_{out}$ | VCO$_{tune\ voltage}$ | Voffset$_{frequency\ select\ voltage}$ |
|---|---|---|
| 12 GHz | 9 V | |
| 11 GHz | 8 V | 8 V |
| 10 GHz | 7 V | |
| 9 GHz | 6 V | |
| 8 GHz | 5 V | |

The use of the offset frequency selection voltage in combination with the locking range reduction removes the requirement for complex filtering of the offset frequency comb signal. This effect is illustrated schematically in FIG. 5. Specifically, the reduced locking range 520 is illustrated in accordance with the offset voltage shown in Table 1. For some embodiments discussed above in relation to FIG. 4, by using an offset voltage of 8V, oscillator 416 will lock to a signal if it is within ±50 MHz offset from 11 GHz. As will be understood by a person of skill in the art, these are examples only and the values can be changed by for example selecting different circuit components.

The above-described embodiments are intended to be examples only. Alterations, modifications and variations can be effected to the particular embodiments by those of skill in the art without departing from the scope, which is defined solely by the claims appended hereto.

What is claimed is:

1. An apparatus for providing an output signal, the apparatus comprising:
   an input for receiving a reference signal;
   an oscillator for providing an output signal;
   an offset signal generator for frequency multiplying the reference signal to generate an offset signal, the offset signal containing a plurality of offset frequencies at harmonics of the reference signal;
   a mixer for mixing the offset signal with the output signal to produce a combined signal,
   a difference detector for detecting a phase difference between the reference signal and the combined signal to provide a control signal based on the detected difference the control signal containing a plurality of control signal frequencies at harmonics of the reference signal, the plurality of control signal frequencies corresponding to the plurality of offset frequencies, each of the plurality of control signal frequencies contained within a respective frequency band; and
   an offset frequency selector for controllably selecting any one of the respective frequency bands of the control signal to select any one of the plurality of control signal frequencies to control the oscillator, such that the output signal is at a predetermined frequency.

2. The apparatus of claim 1, wherein the offset signal generator comprises a comb generator for generating a comb of offset frequencies.

3. The apparatus of claim 1, wherein the offset frequency selector comprises a control signal adjustor coupled between the difference detector and the oscillator, the control signal adjustor adjusting the control signal to correspond to one of the frequency bands of the control signal.

4. The apparatus of claim 3, wherein the offset frequency selector includes a scaling amplifier to scale and provide an offset to the control signal.

5. The apparatus of claim 3, wherein the scaling amplifier comprises an inverting amplifier.

6. The apparatus of claim 5, wherein the scaling amplifier has a gain of less than unity.

7. The apparatus of claim 1, further comprising a frequency divider coupled between the mixer and the difference detector; and wherein the frequency divider has a factor not substantially exceeding 3.

8. The apparatus of claim 1, wherein the mixer is directly coupled to the difference detector such that difference detector receives the feedback signal without any frequency division.

9. A method of generating an output signal to control an oscillator, the method comprising:
   receiving an input signal;
   generating an offset signal by frequency multiplying the input signal, the offset signal containing a plurality of offset frequencies at harmonics of the input signal;
   mixing the offset signal with the output signal to produce a feedback signal,
   detecting a phase difference between the feedback signal and the input signal to generate a control signal based on the detected difference, the control signal containing a plurality of control signal frequencies at harmonics of the input reference signal, the plurality of control signal frequencies corresponding to the plurality of offset frequencies, each of the plurality of control signal frequencies contained within a respective frequency band;
   controllably selecting any one of the respective frequency bands of the control signal to select any one of the plurality of control signal frequencies, such that the output signal is at the predetermined frequency.

10. The method of claim 9, wherein generating the offset signal comprises generating a comb of offset frequencies.

11. The method of claim 9, wherein the output signal is generated by applying a control signal to the oscillator; and wherein the respective frequency band of the control signal is selected by adjusting the output signal applied to the oscillator to correspond to one of the frequency bands of the control signal.

12. The method of claim 11, wherein the control signal is adjusted by:
   scaling the control signal; and
   providing an offset to the control signal.

13. The method of claim 12, wherein the control signal is adjusted by an inverting amplifier.

14. The method of claim 13, wherein the inverting amplifier has a gain of less than unity.

15. The method of claim 9, further comprising frequency dividing the feedback signal by a factor N, a magnitude of factor N not substantially exceeding 3; and wherein detecting a phase difference between the feedback signal and the input signal comprises detecting a phase difference between the frequency divided feedback signal and the input signal.

16. The method of claim 9, wherein detecting a phase difference between the feedback signal and the input signal comprises detecting a phase difference between the feedback signal and the input signal without frequency dividing the feedback signal.

* * * * *